(12) United States Patent
Peters et al.

(10) Patent No.: US 7,531,100 B2
(45) Date of Patent: May 12, 2009

(54) METHOD OF MAKING A FUEL CELL COMPONENT USING AN EASILY REMOVED MASK

(75) Inventors: Scott L Peters, Rochester, NY (US);
Thomas A. Trabold, Pittsford, NY (US);
Gayatri Vyas, Rochester Hills, MI (US);
Reena L. Datta, Rochester Hills, MI (US); Jeffrey M Guzda, Spencerport, NY (US)

(73) Assignee: GM Global Technology Operations, Inc., Detroit, MI (US)

( * ) Notice: Subject to any disclaimer, the term of this patent is extended or adjusted under 35 U.S.C. 154(b) by 171 days.

(21) Appl. No.: 11/463,316

(22) Filed: Aug. 9, 2006

(65) Prior Publication Data

US 2007/0036891 A1  Feb. 15, 2007

Related U.S. Application Data

(60) Provisional application No. 60/707,690, filed on Aug. 12, 2005.

(51) Int. Cl.
*H01B 13/00* (2006.01)
(52) U.S. Cl. ............................. 216/18; 216/17; 216/41; 429/12
(58) Field of Classification Search .................. 216/13, 216/17, 18, 41, 56; 429/12, 34
See application file for complete search history.

(56) References Cited

U.S. PATENT DOCUMENTS

| 3,928,661 | A | * | 12/1975 | Higbee et al. | 427/259 |
| 4,301,237 | A | * | 11/1981 | Burns | 430/394 |
| 6,866,799 | B2 | * | 3/2005 | Orsbon et al. | 252/511 |
| 7,112,287 | B2 | * | 9/2006 | Yagi et al. | 216/56 |
| 2002/0071983 | A1 | * | 6/2002 | Rowen et al. | 429/34 |
| 2002/0197519 | A1 | * | 12/2002 | Einhart et al. | 429/32 |

\* cited by examiner

*Primary Examiner*—Lan Vinh

(57) ABSTRACT

A method of making a fuel cell component using a mask, which is removed after further processing to yield a surface with variable properties.

22 Claims, 2 Drawing Sheets

US 7,531,100 B2

METHOD OF MAKING A FUEL CELL COMPONENT USING AN EASILY REMOVED MASK

CROSS-REFERENCE TO RELATED APPLICATIONS

This application claims the benefit of U.S. Provisional Application No. 60/707,690, filed Aug. 12, 2005.

TECHNICAL FIELD

The disclosure generally relates to a method of making a fuel cell component using a mask.

BACKGROUND

Hydrogen is a very attractive fuel because it is clean and can be used to efficiently produce electricity in a fuel cell. The automotive industry expends significant resources in the development of hydrogen fuel cells as a source of power for vehicles. Such vehicles would be more efficient and generate fewer emissions than today's vehicles employing internal combustion engines.

A hydrogen fuel cell is an electrochemical device that includes an anode and a cathode with an electrolyte therebetween. The anode receives hydrogen-rich gas or pure hydrogen and the cathode receives oxygen or air. The hydrogen gas is dissociated in the anode to generate free protons and electrons. The protons pass through the electrolyte to the cathode. The protons react with the oxygen and the electrons in the cathode to generate water. The electrons from the anode cannot pass through the electrolyte, and thus are directed through a load to perform work before being sent to the cathode. The work may be used to operate a vehicle, for example.

Proton exchange membrane fuel cells (PEMFC) are popular for vehicle applications. The PEMFC generally includes a solid-polymer-electrolyte proton-conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs are relatively expensive to manufacture and require certain conditions for effective operation. These conditions include proper water management and humidification, and control of catalyst poisoning constituents, such as carbon monoxide (CO).

Several fuel cells are typically combined in a fuel cell stack to generate the desired power. For the automotive fuel cell stack mentioned above, the stack may include about two hundred or more bipolar plates. The fuel cell stack receives a cathode reactant gas, typically a flow of air forced through the stack by a compressor. Not all of the oxygen is consumed by the stack and some of the air is output as a cathode exhaust gas that may include liquid water as a stack by-product. The fuel cell stack also receives an anode hydrogen reactant gas that flows into the anode side of the stack.

The fuel cell stack includes a series of flow field or bipolar plates positioned between the several MEAs in the stack. The bipolar plates include an anode side and a cathode side for adjacent fuel cells in the stack. Anode gas flow channels are provided on the anode side of the bipolar plates that allow the anode gas to flow to the anode side of the MEA. Cathode gas flow channels are provided on the cathode side of the bipolar plates that allow the cathode gas to flow to the cathode side of the MEA. The bipolar plates may also include flow channels for a cooling fluid.

The bipolar plates are typically made of a conductive material, such as stainless steel, titanium, aluminum, polymeric carbon composites, etc., so that they conduct the electricity generated by the fuel cells from one cell to the next cell and out of the stack. Metal bipolar plates typically produce a natural oxide on their outer surface that makes them resistant to corrosion. However, this oxide layer is not conductive, and thus increases the internal resistance of the fuel cell, reducing its electrical performance. Also, the oxide layer frequently makes the plates more hydrophobic.

US Patent Application Publication No. 2003/0228512, assigned to the assignee of this application, and the disclosure of which is herein incorporated by reference, discloses a process for depositing a conductive outer layer on a flow field plate that prevents the plate from oxidizing and increasing its ohmic contact. U.S. Pat. No. 6,372,376, also assigned to the assignee of this application, discloses depositing an electrically conductive, oxidation resistant and acid resistant coating on a flow field plate. US Patent Application Publication No. 2004/0091768, also assigned to the assignee of this application, discloses depositing a graphite and carbon black coating on a flow field plate for making the flow field plate corrosion resistant, electrically conductive and thermally conductive.

As is well understood in the art, the membranes within a fuel cell need to have a certain relative humidity so that the ionic resistance across the membrane is low enough to effectively conduct protons. During operation of the fuel cell, moisture from the MEAs and external humidification may enter the anode and cathode flow channels. At low cell power demands, typically below 0.2 A/cm$^2$, water accumulates within the flow channels because the flow rate of the reactant gas is too low to force the water out of the channels. As the water accumulates, it forms droplets that continue to expand because of the hydrophobic nature of the plate material. The contact angle of the water droplets is generally about 90° in that the droplets form in the flow channels substantially perpendicular to the flow direction of the reactant gas. As the size of the droplets increases, the flow channel is closed off, and the reactant gas is diverted to other flow channels because the channels flow in parallel between common inlet and outlet manifolds. Because the reactant gas may not flow through a channel that is blocked with water, the reactant gas cannot force the water out of the channel. Those areas of the membrane that do not receive reactant gas as a result of the channel being blocked will not generate electricity, thus resulting in a non-homogenous current distribution and reducing the overall efficiency of the fuel cell. As more and more flow channels are blocked by water, the electricity produced by the fuel cell decreases, where a cell voltage potential less than 200 mV is considered a cell failure. Because the fuel cells are electrically coupled in series, if one of the fuel cells stops performing, the entire fuel cell stack may stop performing.

It is usually possible to purge the accumulated water in the flow channels by periodically forcing the reactant gas through the flow channels at a higher flow rate. However, on the cathode side, this increases the parasitic power applied to the air compressor, thereby reducing overall system efficiency. Moreover, there are many reasons not to use the hydrogen fuel as a purge gas, including reduced economy, reduced system efficiency and increased system complexity for treating elevated concentrations of hydrogen in the exhaust gas stream.

Reducing accumulated water in the channels can also be accomplished by reducing inlet humidification. However, it is desirable to provide some relative humidity in the anode and cathode reactant gases so that the membrane in the fuel cells remains hydrated. A dry inlet gas has a drying effect on the membrane that could increase the cell's ionic resistance, and limit the membrane's long-term durability.

It has been proposed by the present inventors to make bipolar plates for a fuel cell hydrophilic to improve channel water transport. A hydrophilic plate causes water in the channels to spread along the surface in a process termed spontaneous wetting. The resulting thin film has less of a tendency to alter the flow distribution along the array of channels connected to the common inlet and outlet headers. If the plate material has sufficiently high surface energy, water transported through the diffusion media will contact the channel walls and then, by capillary force, be transported into the bottom corners of the channel along its length. The physical requirements to support spontaneous wetting in the corners of a flow channel are described by the Concus-Finn condition, $$\beta + \frac{\alpha}{2} < 90°,$$

where $\beta$ is the static contact angle formed between a liquid surface and solid surface and $\alpha$ is the channel corner angle. For a rectangular channel $\alpha/2=45°$, which dictates that spontaneous wetting will occur when the static contact angle is less than 45°. For the roughly rectangular channels used in current fuel cell stack designs with composite bipolar plates, this sets an approximate upper limit on the contact angle needed to realize the beneficial effects of hydrophilic plate surfaces on channel water transport and low load stability.

SUMMARY OF EXEMPLARY EMBODIMENTS OF THE INVENTION

One embodiment of the invention is a method of making a fuel cell component using a mask may be washed, peeled or scraped away without damaging the fuel cell component.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF PREFERRED EMBODIMENTS

The following description of the preferred embodiment(s) is merely exemplary in nature and is in no way intended to limit the invention, its application, or uses.

Figure 1:
FIG. 1 illustrates a substrate useful in making a fuel cell component according to one embodiment of the invention.

FIG. 1 illustrates a substrate 10 useful in making a fuel cell component such as, but not limited to, a bipolar plate 8. The substrate 10 is substantially flat and includes an upper surface 12. The substrate 10 may be a metal, such as high-grade stainless steel, or an electrically conductive composite material.

Figure 2:
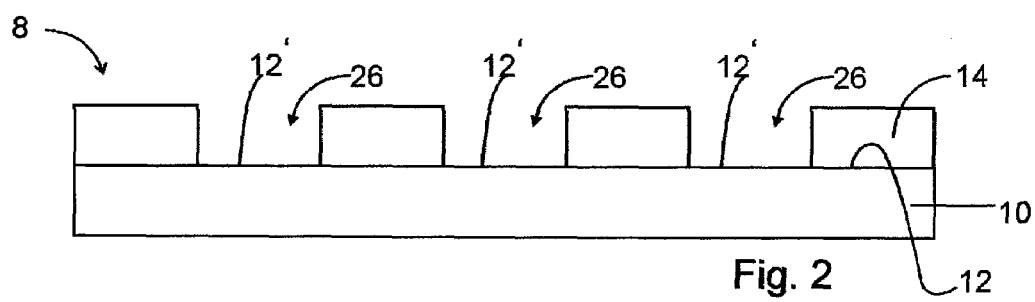
FIG. 2 illustrates a process according to one embodiment of the invention including depositing a mask material on a substrate.

Referring now to FIG. 2, in one embodiment of the invention, a mask material 14 is selectively deposited over portions of the upper surface 12 of the substrate 10. The mask material 14 may be brushed, rolled painted, screen printed or printed onto the substrate 10. The mask material 14 may be any material that may be applied in a liquid state and stays liquid or may dry thereafter, and may be peeled or washed away without damaging the substrate. The liquid mask material may include a earth material, such as diatomaceous earth, a salt, a sugar, a flour, or a grain. In one embodiment the liquid mask material includes at least one of water or alcohol. In one embodiment of the invention, the liquid mask includes a sodium salt of polymeric carboxylic acid and diatomaceous earth in a water-alcohol solution. A suitable mask material is available from Techspray, L.P in Amarillo, Tex. under the tradename "WONDERMASK." The liquid mask may be selectively deposited on the upper surface 12 of the substrate 10 leaving portions 12' of the upper surface 12 exposed. Openings or channels 26 may be provided between adjacent portions of the mask 14. Work may be performed on the exposed portion 12' of the upper surface 12. The work may include, but is not limited to, cleaning, etching, pitting, ion implanting, bombarding, doping, blasting or coating the exposed portion 12' of the upper surface.

Figure 3:
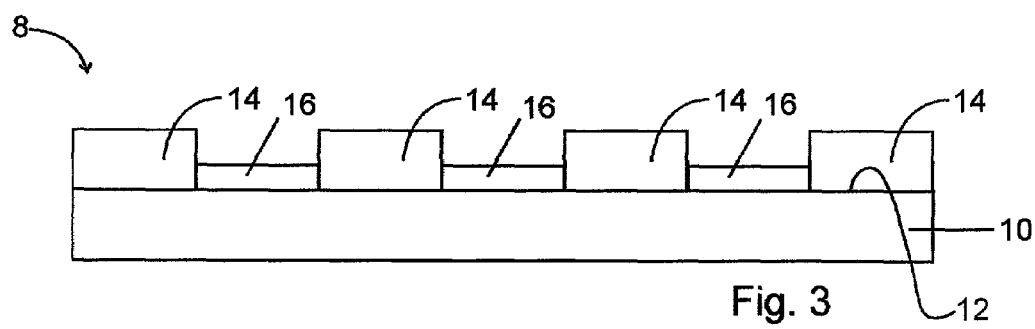
FIG. 3 illustrates a process according to one embodiment of the invention including depositing a coating in the opening between portions of the remaining mask material.

Referring now to FIG. 3, in one embodiment of the invention a coating 16, such as a hydrophilic coating, flows through the channel 26 between adjacent portions of the mask 14, and the coating is cured.

Figure 4:
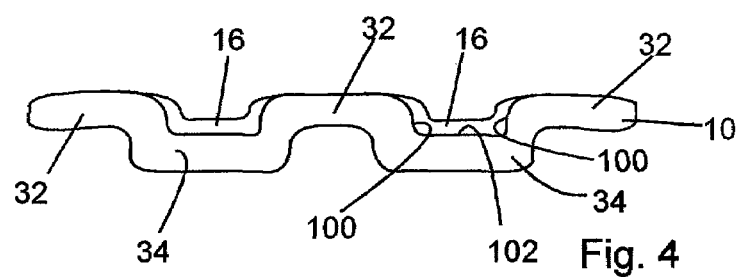
FIG. 4 illustrates a process according to one embodiment of the invention including removing the mask material and forming the substrate into a bipolar plate.

Referring now to FIG. 4, after the mask 14 is removed, the substrate 10 can be formed into a fuel cell component such as a bipolar plate 8. The forming may be done by stamping or the like. The mask 14 may be removed in a bath including water, or by spraying water over the substrate. Alternatively, in one embodiment of the invention, the mask 14 may be peeled away or scraped off of the upper surface 12 of the substrate 10. The bipolar plate 8 includes lands 32 and channels 34. Preferably the coating 16 remains only in the channels 34 of the bipolar plate 8. The channels 34 of the bipolar plate 8 may be defined by sidewalls 100 and a floor 102. The coating 16 may be on the side walls 100 and floor 102, or only on the floor 102.

Figure 5:
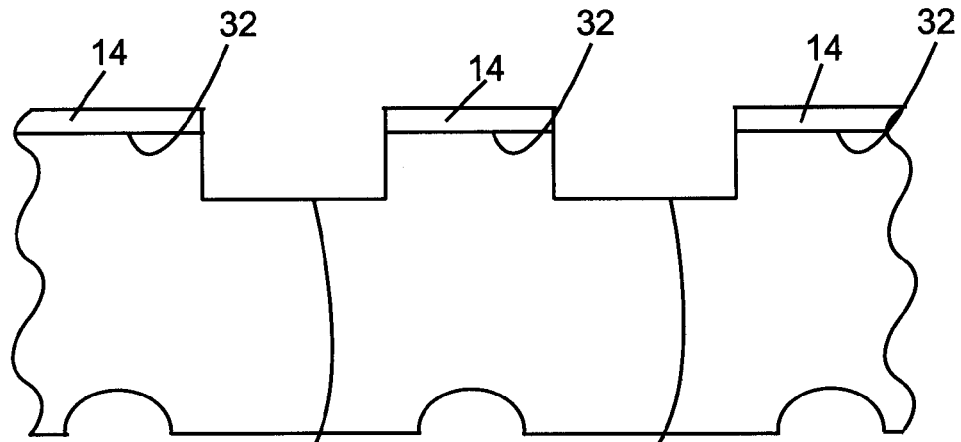
FIG. 5 illustrates a process according to one embodiment of the invention including depositing a mask material over the lands of a bipolar plate.

Referring now to FIG. 5, in another embodiment of the invention, a mask 14 is deposited over the lands 32 of the bipolar plate 8 leaving the channels 34 of the bipolar plate 8 uncovered and exposed. Again, the above described types of work may now be performed on the exposed portion of the bipolar plate.

Figure 6:
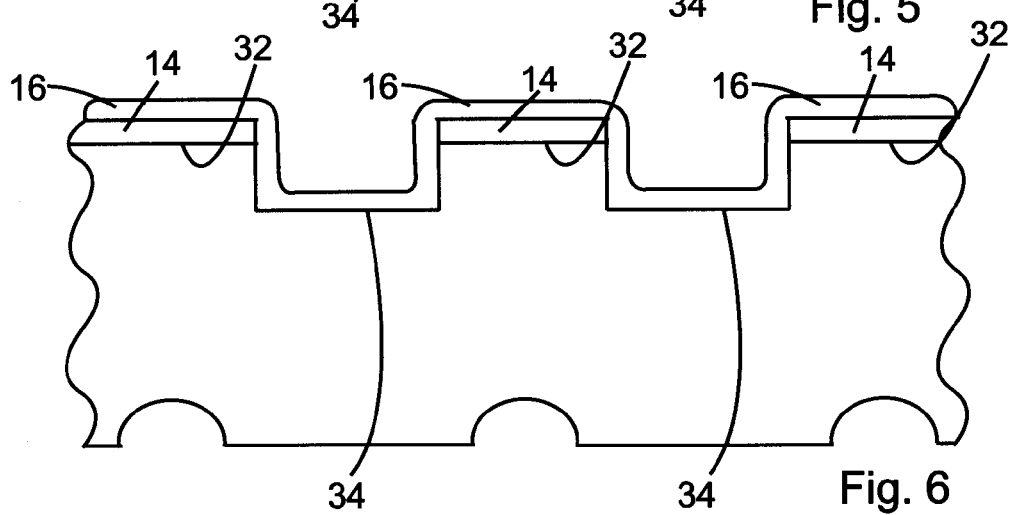
FIG. 6 illustrates a process according to one embodiment of the invention including depositing a coating over the mask material and into the channels.
Figure 7:
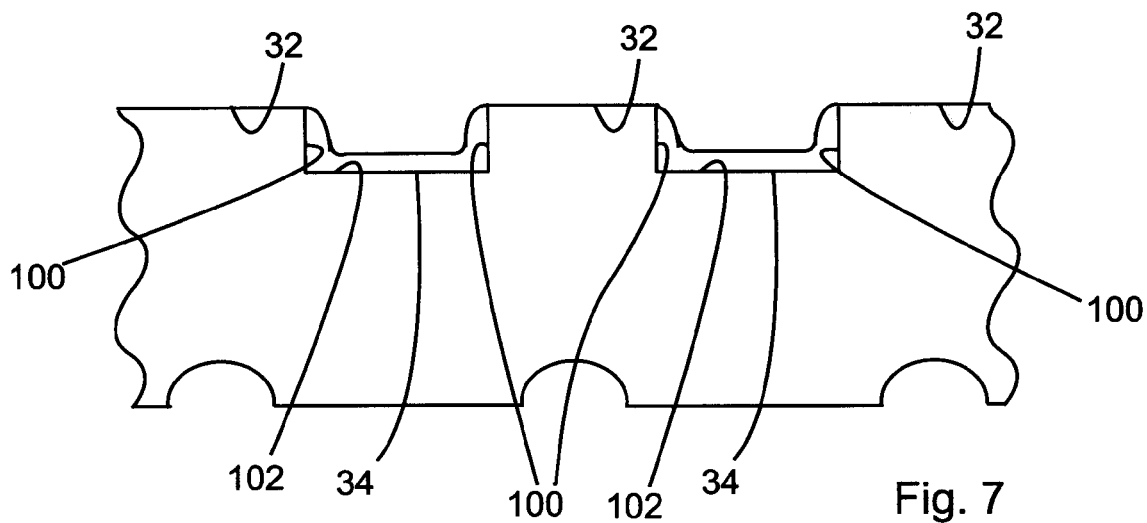
FIG. 7 illustrates a process according to one embodiment of the invention including removing the mask and then coating over the mask to leave the coating in the channels.

Referring now to FIG. 6, a coating 16, such as a hydrophilic coating, is deposited over the mask 14 and the exposed potions 34 of the bipolar plate 8. The hydrophilic coating 16 may, in one embodiment of the invention, include inorganic and organic structures. Examples of suitable hydrophilic coatings include, but are not limited to, coatings including metal oxides, including $SiO_2$, $HfO_2$, $ZrO_2$, $Al_2O_3$, $SnO_2$, $Ta_2O_5$, $Nb_2O_5$, $MoO_2$, $IrO_2$, $RuO_2$, metastable oxynitrides, nonstoichiometric metal oxides, oxynitrides, and derivatives thereof including carbon chains or including carbon and/or polar groups, and mixtures thereof. The coating 16 may be depositing by spraying, brushing, rolling, printing, dipping, physical vapor deposition, chemical vapor deposition or plasma assisted vapor deposition. Thereafter, the coating 16 may be cured and the mask removed along with any coating covering the mask 14 to leave the coating 16 only in the channels 34 of the bipolar plate 8, as shown in FIG. 7.

When the terms "over", "overlying", "overlies" or the like are used herein with respect to the relative position of layers to each other such shall mean that the layers are in direct contact with each other or that another layer or layers may be interposed between the layers.

The description of the invention is merely exemplary in nature and, thus, variations thereof are not to be regarded as a departure from the spirit and scope of the invention.

What is claimed is:

1. A process comprising:
   depositing a mask having openings therethrough over portions of a substrate for use in a fuel cell, the mask leaving portion of the substrate exposed;
   depositing a coating over the mask and over the exposed portions of the substrate and curing the coating;
   removing the mask and the portion of the cured coating over the mask, leaving the cured coating only over the exposed portions of the substrate;
   and wherein the mask may be removed by at least one of washing, peeling or scraping the mask away.

2. A process as set forth in claim 1 wherein the substrate comprises a metal or an electrically conductive composite material.

3. A process as set forth in claim 1 wherein depositing a coating over the mask and over the exposed portions of the substrate comprises flowing a coating through the openings in the mask.

4. A process as set forth in claim 1 wherein the mask comprises at least one of an earth material, a salt, a sugar, a flour, or a grain.

5. A process as set forth in claim 1 wherein the mask comprises diatomaceous earth.

6. A process as set forth in claim 5 wherein the mask further comprises a sodium salt of carboxylic acid.

7. A process as set forth in claim 1 wherein the removing the mask comprises washing the mask off of the substrate.

8. A process as set forth in claim 1 wherein the substrate is substantially flat prior to depositing the mask and after removing the mask, forming the substrate into a bipolar plate having lands and channels.

9. A process comprising:
   providing a bipolar plate including a pre-formed flow field including lands and channels;
   thereafter depositing a mask material over the lands of the pre-formed flow field and leaving the channels exposed;
   performing work on the channels of the bipolar plate; and
   wherein the mask may be removed by at least one of washing, peeling or scraping the mask away,
   wherein the work comprises depositing a coating over the mask and over the channels of the bipolar plate and curing the coating,
   further comprising removing the mask and any coating over the mask to leave coating only over the channels.

10. A process as set forth in claim 9 wherein the bipolar plate comprises a metal or an electrically conductive composite material.

11. A process as set forth in claim 9 wherein depositing a mask comprises spraying, brushing, rolling, printing or dipping.

12. A process as set forth in claim 9 wherein the mask comprises at least one of an earth material, a salt, a sugar, a flour, or a grain.

13. A process as set forth in claim 9 wherein the removing the mask comprises washing the mask off of the lands.

14. A process as set forth in claim 9 wherein the removing the mask comprises peeling the mask off of the lands.

15. A process as set forth in claim 9 wherein the removing comprises scraping the mask off of the lands.

16. A process as set forth in claim 9 wherein depositing a coating comprises at least one of spraying, brushing, rolling, printing or dipping.

17. A process as set forth in claim 9 wherein depositing a coating comprises at least one of physical vapor deposition, chemical vapor deposition or plasma assisted vapor deposition.

18. A process as set forth in claim 9 wherein the mask comprises diatomaceous earth.

19. A process as set forth in claim 18 wherein the mask further comprises a sodium salt of carboxylic acid.

20. A process as set forth in claim 9 further comprising removing the mask.

21. A process as set forth in claim 20 wherein the removing the mask comprises washing the mask off of the lands.

22. A process as set forth in claim 20 wherein removing the mask comprises peeling the mask off of the lands.

* * * * *